(12) United States Patent
Philipp et al.

(10) Patent No.: US 7,679,074 B2
(45) Date of Patent: Mar. 16, 2010

(54) INTEGRATED CIRCUIT HAVING MULTILAYER ELECTRODE

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 56 days.

(21) Appl. No.: 11/766,822

(22) Filed: Jun. 22, 2007

(65) Prior Publication Data
US 2008/0315173 A1 Dec. 25, 2008

(51) Int. Cl.
*H01L 47/00* (2006.01)
(52) U.S. Cl. .................. 257/2; 257/4; 257/E31.029
(58) Field of Classification Search ............ 257/2, 257/3, 4, 5, 9, E31.029
See application file for complete search history.

(56) References Cited

U.S. PATENT DOCUMENTS 7,394,088 B2 * 7/2008 Lung ..................... 257/2

2005/0030800 A1 2/2005 Johnson et al.
2006/0113573 A1 6/2006 Cheong et al.

OTHER PUBLICATIONS

"A 0.1um 1.8V 256Mb 66MHz Synchronous Burst PRAM", Sangbeom Kang, et al., IEEE International Solid-State Circuits Conference, 2006 (3 pgs.).
"Full Integration and Reliability Evaluation of Phase-Change RAM Based on .24um-CMOS Technologies", Y.N. Hwang, et al., Symposium on VLSI Technology Digest of Technical Papers, 2003 (2 pgs.).
"Highly Manufacturable High Density Phase Change Memory of 64Mb and Beyond", S.J. Ahn, et al., IEEE.2004 (4 pgs.).

* cited by examiner

*Primary Examiner*—Hoai v Pham
(74) *Attorney, Agent, or Firm*—Dicke, Billig & Czaja, PLLC

(57) ABSTRACT

An integrated circuit includes a contact and a first electrode coupled to the contact. The first electrode includes at least two electrode material layers. The at least two electrode material layers include different materials. The integrated circuit includes a second electrode and a resistivity changing material between the first electrode and the second electrode.

25 Claims, 8 Drawing Sheets

INTEGRATED CIRCUIT HAVING MULTILAYER ELECTRODE

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of-resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

One type of phase change memory. cell includes phase change material between a bottom electrode and a top electrode. A contact couples the top electrode to upper metallization layers. To reduce the power used to program the phase change material to an amorphous state, heat loss from the phase change material during programming should be minimized.

For these and other reasons, there is a need for the present invention.

SUMMARY

One embodiment provides an integrated circuit. The integrated circuit includes a contact and a first electrode coupled to the contact. The first electrode includes at least two electrode material layers. The at least two electrode material layers include different materials. The integrated circuit includes a second electrode and a resistivity changing material between the first electrode and the second electrode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
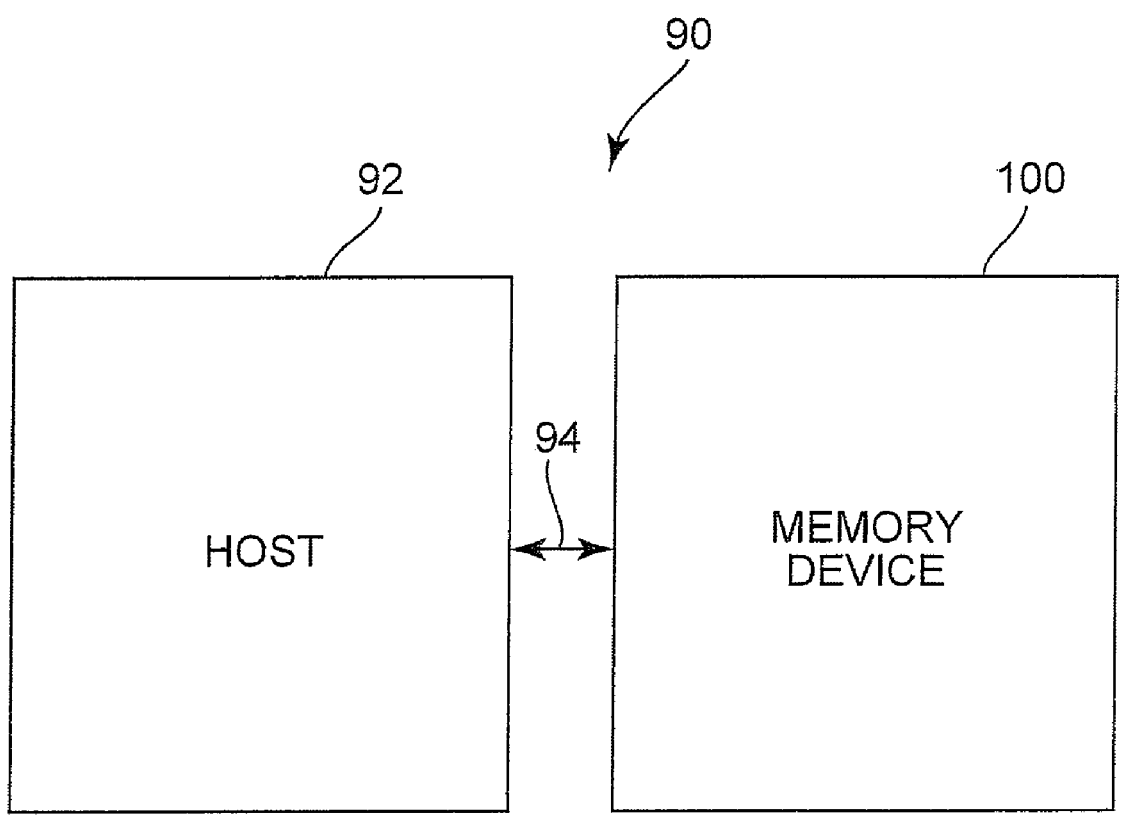
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing material memory device.

Figure 2:
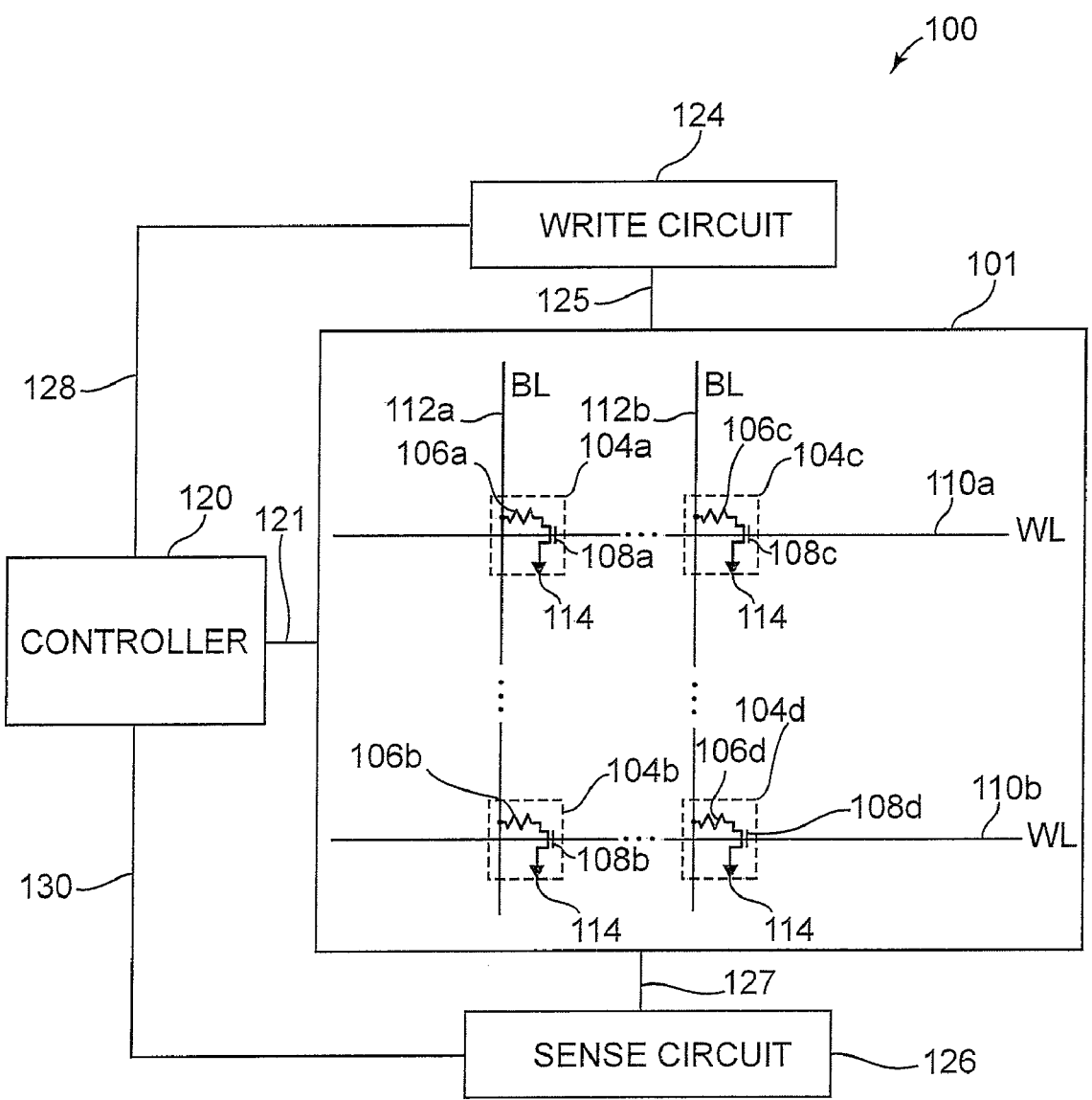
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Each phase change memory cell 104 includes a multilayer bottom electrode. The multilayer bottom electrode thermally insulates the phase change material of each memory cell. The top layer of the multilayer bottom electrode includes a material having good adhesion and interface stability with the phase change material. The bottom layer of the multilayer bottom electrode includes a material having good adhesion and a low resistive interface to the bottom contact.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In one embodiment, sense circuit 126 provides voltage across one of the memory cells 104 and reads the current that flows through that one of the memory cells 104. In one embodiment, write circuit 124 provides voltage across one of the memory cells 104 and sense circuit 126 reads the current that flows through that one of the memory cells 104. In one embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 100 are set and reset similarly to phase change memory cell 104a using a similar current or voltage pulse.

Figure 3:
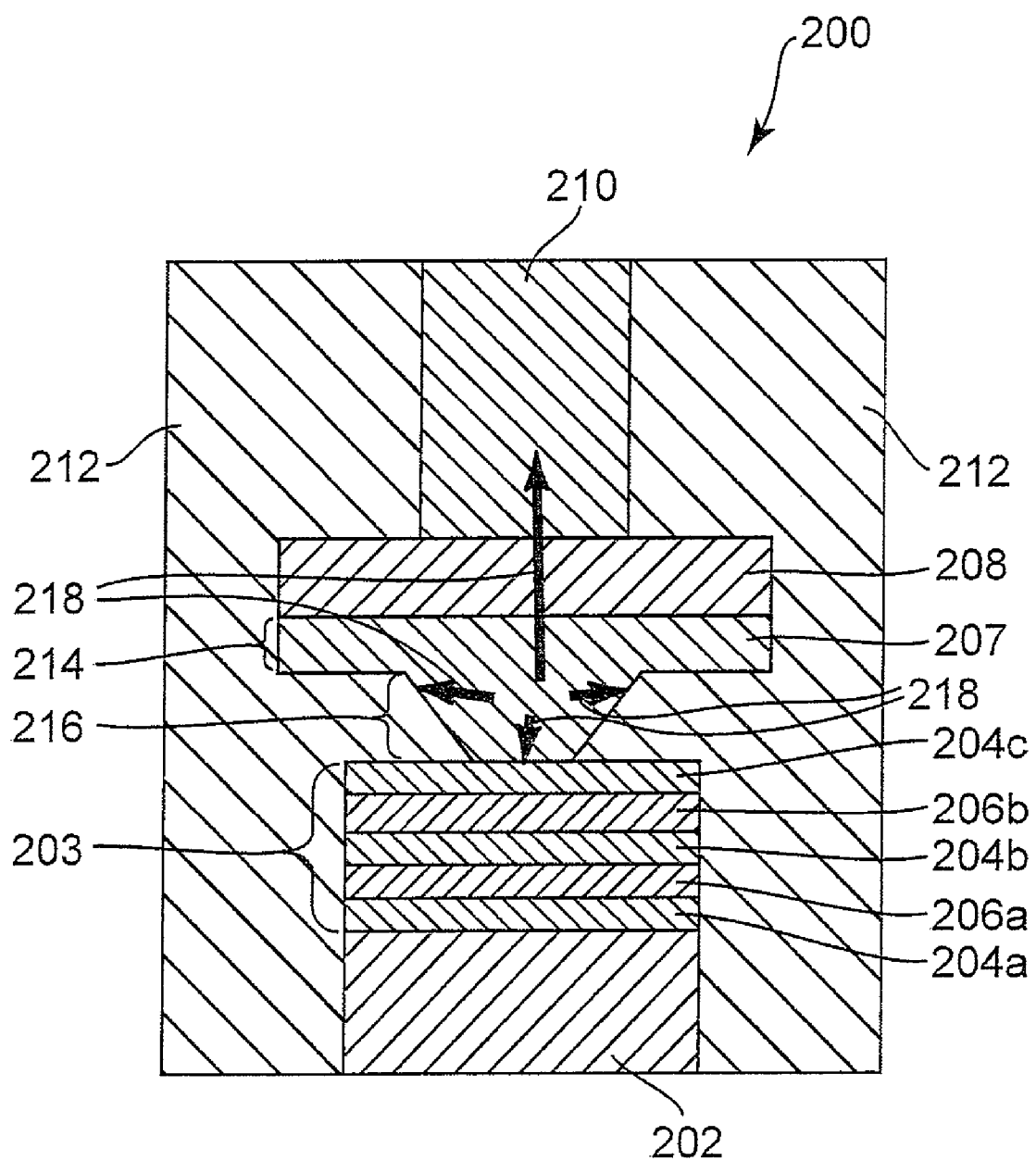
FIG. 3 illustrates a cross-sectional view of one embodiment of a phase change element.

FIG. 3 illustrates a cross-sectional view of one embodiment of a phase change element 200. In one embodiment, each phase change element 106 is similar to phase change element 200. Phase change element 200 includes a bottom contact 202, a bottom electrode 203, a phase change material storage location 207, a top electrode 208, a top contact 210, and dielectric material 212. Phase change material storage location 207 includes a first portion 216 and a second portion 214. In one embodiment, phase change material storage location 207 is a pore phase change material storage location. First portion 216 of phase change material storage location 207 is tapered. In one embodiment, second portion 214 of phase change material storage location 207 has the same cross-sectional width as top electrode 208. Bottom electrode 203 includes electrode material layers 204a-204c and 206a-206b. In other embodiments, bottom electrode 203 includes any suitable number of electrode material layers, such as two, three, four, five, or more electrode material layers.

Bottom contact 202 includes TiN, TaN, W, Al, Ti, Ta, TiSiN, TaSiN, TaCN, TiAlN, TaAlN, Cu, WN, C, or other suitable contact material. The top of bottom contact 202 contacts the bottom of bottom electrode 203. In particular, the top of bottom contact 202 contacts the bottom of electrode material layer 204a. The top of electrode material layer 204a contacts the bottom of electrode material layer 206a. The top of electrode material layer 206a contacts the bottom of electrode material layer 204b. The top of electrode material layer 204b contacts the bottom of electrode material layer 206b. The top of electrode material layer 206b contacts the bottom of electrode material layer 204c. Electrode material layers 204a-204c include TiN, TaN, W, Al, Ti, Ta, TiSiN, TaSiN, TaCN, TiAlN, TaAlN, Cu, WN, C, or other suitable electrode material. Electrode material layers 206a-206b include a material different from electrode material layers 204a-204c and include TiN, TaN, W, Al, Ti, Ta, TiSiN, TaSiN, TaCN, TiAlN, TaAlN, Cu, WN, C, Si, Ge, a phase change material, or other suitable electrically conductive material.

The top of bottom electrode 203 contacts the bottom of phase change material storage location 207. In particular, the top of electrode material layer 204c contacts the bottom of first portion 216 of phase change material storage location 207. Phase change material storage location 207 provides a storage location for storing one or more bits of data. The active or phase change region in phase change material storage location 207 is at the interface between phase change material storage location 207 and bottom electrode 203.

The top of second portion 214 of phase change material storage location 207 contacts the bottom of top electrode 208. Top electrode 208 includes TiN, TaN, W, Al, Ti, Ta, TiSiN, TaSiN, TaCN, TiAlN, Cu, WN, C, or other suitable electrode material. The top of top electrode 208 contacts the bottom of top contact 210. Top contact 210 includes TiN, TaN, W, Al, Ti, Ta, TiSiN, TaSiN, TaCN, TiAlN, Cu, WN, C, or other suitable contact material. Top contact 210, top electrode 208, phase change material storage location 207, bottom electrode 203, and bottom contact 202 are laterally surrounded by dielectric material 212. Dielectric material 212 includes $SiO_2$, $SiO_x$, SiN, fluorinated silica glass (FSG), boro-phosphorous silicate glass (BPSG), boro-silicate glass (BSG), or other suitable dielectric material.

The current path through memory element 200 is from top contact 210 through top electrode 208, phase change material storage location 207, and bottom electrode 203 to bottom contact 202. In another embodiment, the current path is reversed. The heat loss within phase change element 200 during a programming operation is indicated by arrows 218 extending away from phase change material storage location 207. Compared to a typical bottom electrode including a solid block of material, multilayer bottom electrode 203 reduces the heat loss in the lower direction due to the low thermal conductivity of bottom electrode 203. Multilayer bottom electrode 203 reduces the heat loss from phase change material storage location 207 during programming, thus reducing the power used to program phase change element 200.

During operation, current or voltage pulses are applied between top contact 210 and bottom contact 202 to program phase change element 200. During a set operation of phase change element 200, a set current or voltage pulse is selectively enabled by write circuit 124 and sent through a bit line to top contact 210. From top contact 210, the set current or voltage pulse passes through top electrode 208 and phase change material storage location 207 thereby heating the phase change material above its crystallization temperature (but usually below its melting temperature). In this way, the phase change material reaches a crystalline state or a partially crystalline and partially amorphous state during the set operation.

During a reset operation of phase change element 200, a reset current or voltage pulse is selectively enabled by write circuit 124 and sent through a bit line to top contact 210. From top contact 210, the reset current or voltage pulse passes through top electrode 208 and phase change material storage location 207. The reset current or voltage quickly heats the phase change material above its melting temperature. After the current or voltage pulse is turned off, the phase change material quickly quench cools into an amorphous state or a partially amorphous and partially crystalline state.

The following FIGS. 4-14 illustrate embodiments for fabricating a phase change element, such as phase change element 200 previously described and illustrated with reference to FIG. 3.

Figure 4:
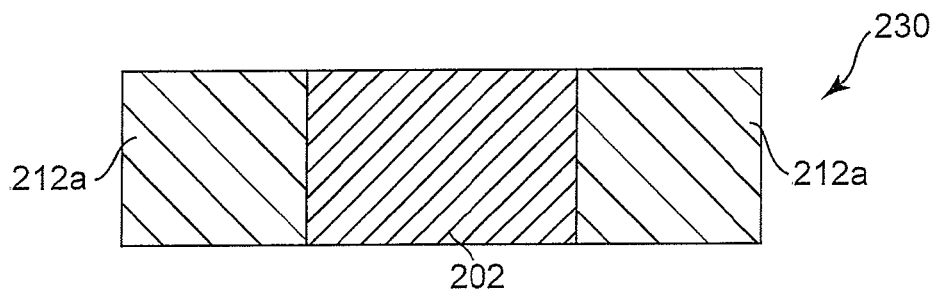
FIG. 4 illustrates a cross-sectional view of one embodiment of a preprocessed wafer.

FIG. 4 illustrates a cross-sectional view of one embodiment of a preprocessed wafer 230. Preprocessed wafer 230 includes bottom contact202, dielectric material 212a, and lower wafer layers (not shown). In one embodiment, the lower wafer layers include access devices, such as transistors or diodes, where each transistor or diode is coupled to a bottom contact 202. Bottom contact 202 includes TiN, TaN, W, Al, Ti, Ta, TiSiN, TaSiN, TaCN, TiAlN, TaAlN, Cu, WN, C, or other suitable contact material. Bottom contact 202 is laterally surrounded by dielectric material 212a. Dielectric material 212a includes $SiO_2$, $SiO_x$, SiN, FSG, BPSG, BSG, or other suitable dielectric material.

Figure 5:
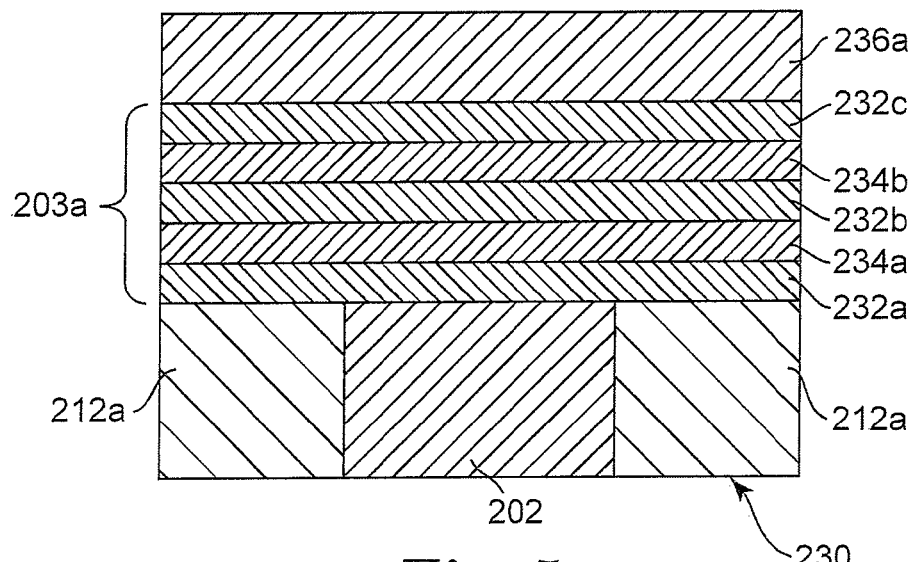
FIG. 5 illustrates a cross-sectional view of one embodiment of the preprocessed wafer, multiple electrode material layers, and a planarization stop material layer.

FIG. 5 illustrates a cross-sectional view of one embodiment of preprocessed wafer 230, multiple electrode material layers 203a, and a planarization stop material layer 236a. An electrode material, such as TiN, TaN, W, Al, Ti, Ta, TiSiN, TaSiN, TaCN, TiAlN, TaAlN, Cu, WN, C, Si, Ge, a phase change material, or other suitable electrode material is deposited over preprocessed wafer 230 to provide electrode material layer 232a. Electrode material layer 232a is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique.

An electrode material, different from electrode material layer 232a, such as TiN, TaN, W, Al, Ti, Ta, TiSiN, TaSiN, TaCN, TiAlN, TaAlN, Cu, WN, C, Si, Ge, a phase change material, or other suitable electrode material is deposited over electrode material layer 232a to provide electrode material layer 234a. Electrode material layer 234a is deposited using CVD, HDP-CVD, ALD, MOCVD, PVD, JVD, or other suitable deposition technique.

The same electrode material as electrode material layer 232a or another suitable electrode material, such as TiN, TaN, W, Al, Ti, Ta, TiSiN, TaSiN, TaCN, TiAlN, TaAlN, Cu, WN, C, Si, Ge, or a phase change material is deposited over electrode material layer 234a to provide electrode material layer 232b. Electrode material layer 232b is deposited using CVD, HDP-CVD, ALD, MOCVD, PVD, JVD, or other suitable deposition technique.

The same electrode material as electrode material layer 234a or another suitable electrode material, such as TiN, TaN, W, Al, Ti, Ta, TiSiN, TaSiN, TaCN, TiAlN, TaAlN, Cu, WN, C, Si, Ge, or a phase change material is deposited over electrode material layer 232b to provide electrode material layer 234b. Electrode material layer 234b is deposited using CVD, HDP-CVD, ALD, MOCVD, PVD, JVD, or other suitable deposition technique.

The same electrode material as electrode material layers 232a and 232b or another suitable electrode material, such as TiN, TaN, W, Al, Ti, Ta, TiSiN, TaSiN, TaCN, TiAlN, TaAlN, Cu, WN, or C is deposited over electrode material layer 234b to provide electrode material layer 232c. Electrode material layer 232c is deposited using CVD, HDP-CVD, ALD, MOCVD, PVD, JVD, or other suitable deposition technique. In other embodiments, another suitable number of electrode material layers, such as two, three, four, five, or more electrode material layers are deposited to provide multiple electrode material layers 203a.

An optional planarization stop material, such as SiN or other suitable planarization stop material is deposited over electrode material layer 232c to provide planarization stop material layer 236a. Planarization stop material layer 236a is deposited using CVD, HDP-CVD, ALD, MOCVD, PVD, JVD, or other suitable deposition technique. In another embodiment, planarization stop material layer 236a is excluded.

Figure 6:
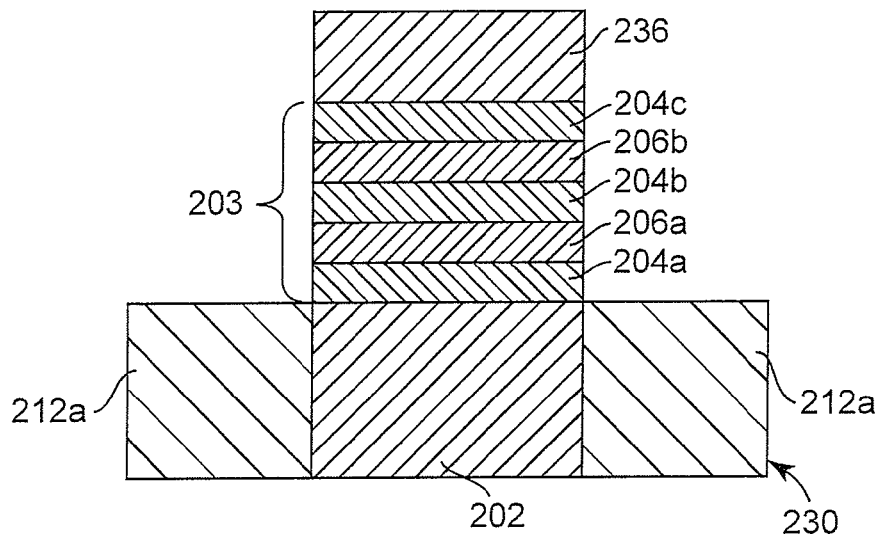
FIG. 6 illustrates a cross-sectional view of one embodiment of the preprocessed wafer, a bottom electrode, and the planarization stop material layer after etching.

FIG. 6 illustrates a cross-sectional view of one embodiment of preprocessed wafer 230, bottom electrode 203, and planarization stop material layer 236 after etching planarization stop material layer 236a and multiple electrode material layers 203a. Planarization stop material layer 236a and multiple electrode material layers 203a are etched to expose portions of preprocessed wafer 230 and to provide bottom electrode 203 and planarization stop material layer 236. In one embodiment, planarization stop material layer 236 and bottom electrode 203 are substantially centered over bottom contact 202.

Figure 7:
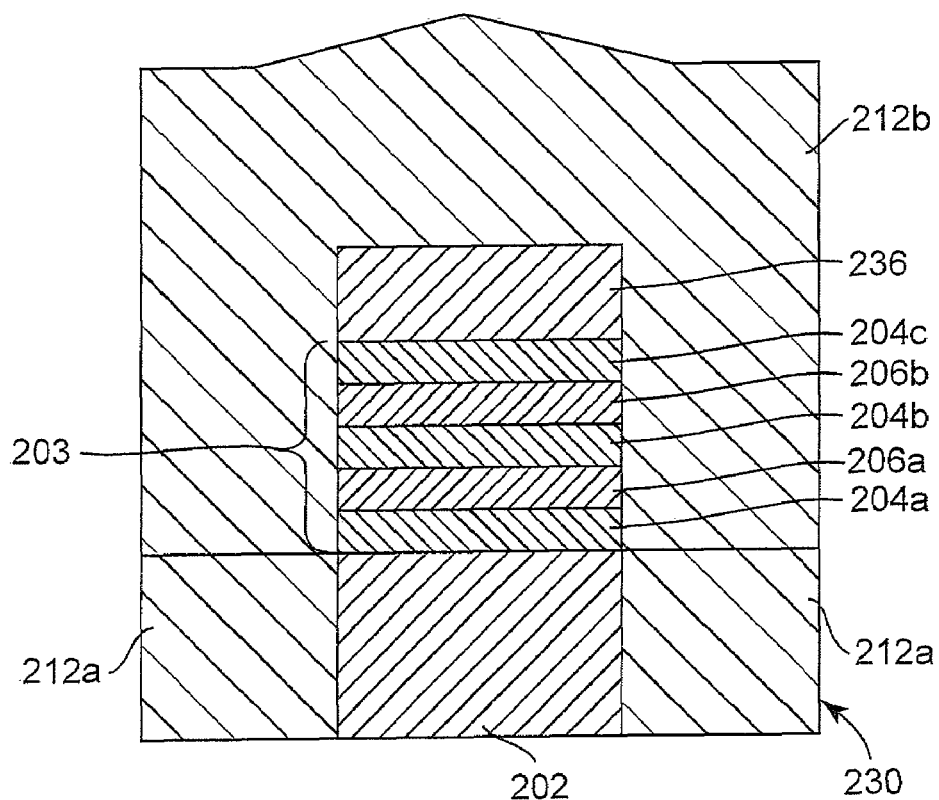
FIG. 7 illustrates a cross-sectional view of one embodiment of the preprocessed wafer, the bottom electrode, the planarization stop material layer, and a first dielectric material layer.

FIG. 7 illustrates a cross-sectional view of one embodiment of preprocessed wafer 230, bottom electrode 203, planarization stop material layer 236, and a first dielectric material layer 212b. A dielectric material, such as $SiO_2$, $SiO_x$, SiN, FSG, BPSG, BSG, or other suitable dielectric material is deposited over exposed portions of preprocessed wafer 230, bottom electrode 203, and planarization stop material layer 236 to provide first dielectric material layer 212b. First dielectric material layer 212b is deposited using CVD, HDP-CVD, ALD, MOCVD, PVD, JVD, or other suitable deposition technique.

Figure 8:
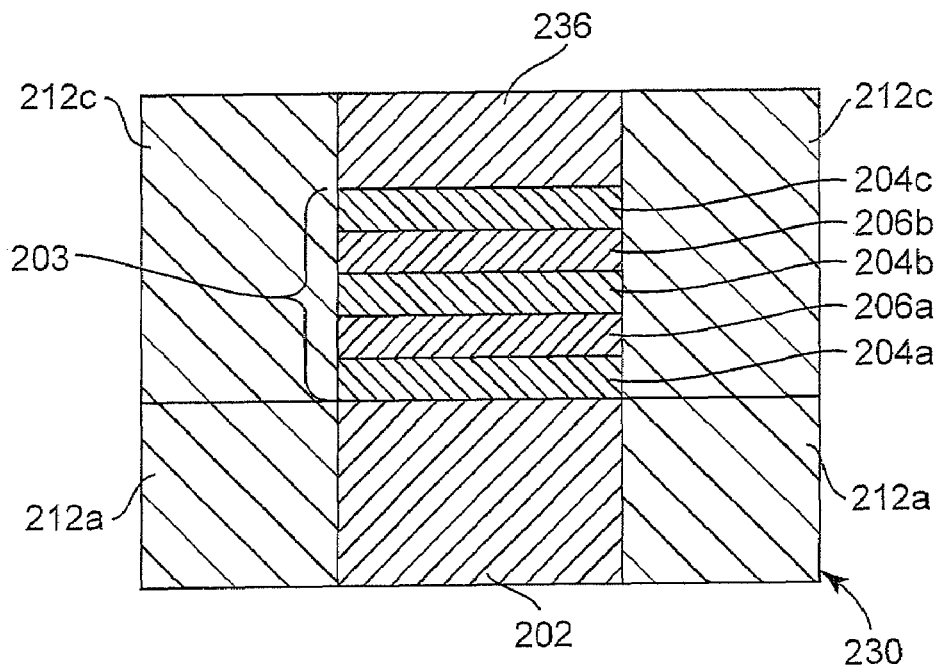
FIG. 8 illustrates a cross-sectional view of one embodiment of the preprocessed wafer, the bottom electrode, the planarization stop material layer, and the first dielectric material layer after planarization.

FIG. 8 illustrates a cross-sectional view of one embodiment of preprocessed wafer 230, bottom electrode 203, planarization stop material layer 236, and first dielectric material layer 212c after planarizing first dielectric material layer 212b. First dielectric material layer 212b is planarized to expose planarization stop material layer 236 and to provide first dielectric material layer 212c. In other embodiments, where planarization stop material layer 236 is excluded, first dielectric material layer 212b is planarized to expose one of electrode materials layers 204c, 206b, or 204b. Dielectric material layer 212b is planarized using chemical mechanical planarization (CMP) or another suitable planarization technique. In one embodiment, where planarization stop material layer 236 is excluded, once bottom electrode.203 is exposed by planarization a selective wet etch or other suitable etch is used to individually remove electrode material layers until the desired electrode material layer is exposed. A suitable number of electrode material layers, such as one, two, or more, are individually removed to expose a suitable electrode material layer having good contact and adhesion properties. In one embodiment, the exposed electrode material layer does not comprise Si, Ge, or a phase change material.

Figure 9:
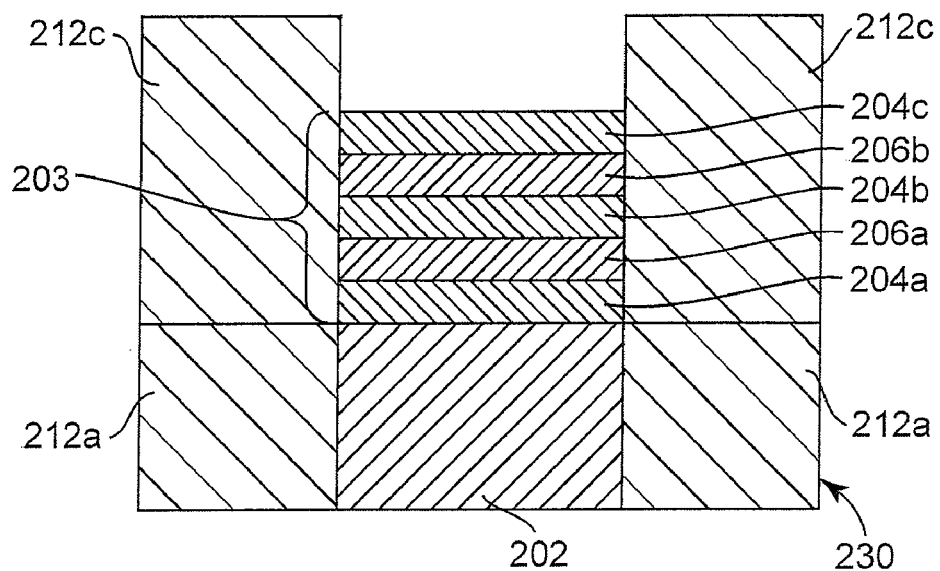
FIG. 9 illustrates a cross-sectional view of one embodiment of the preprocessed wafer, the bottom electrode, and the first dielectric material layer after removing the planarization stop material layer.

FIG. 9 illustrates a cross-sectional view of one embodiment of preprocessed wafer 230, bottom electrode 203, and first dielectric material layer 212c after removing planarization stop material layer 236. Planarization stop material layer 236 is removed using a selective wet etch or other suitable etch to expose electrode material layer 204c of bottom electrode 203.

Figure 10:
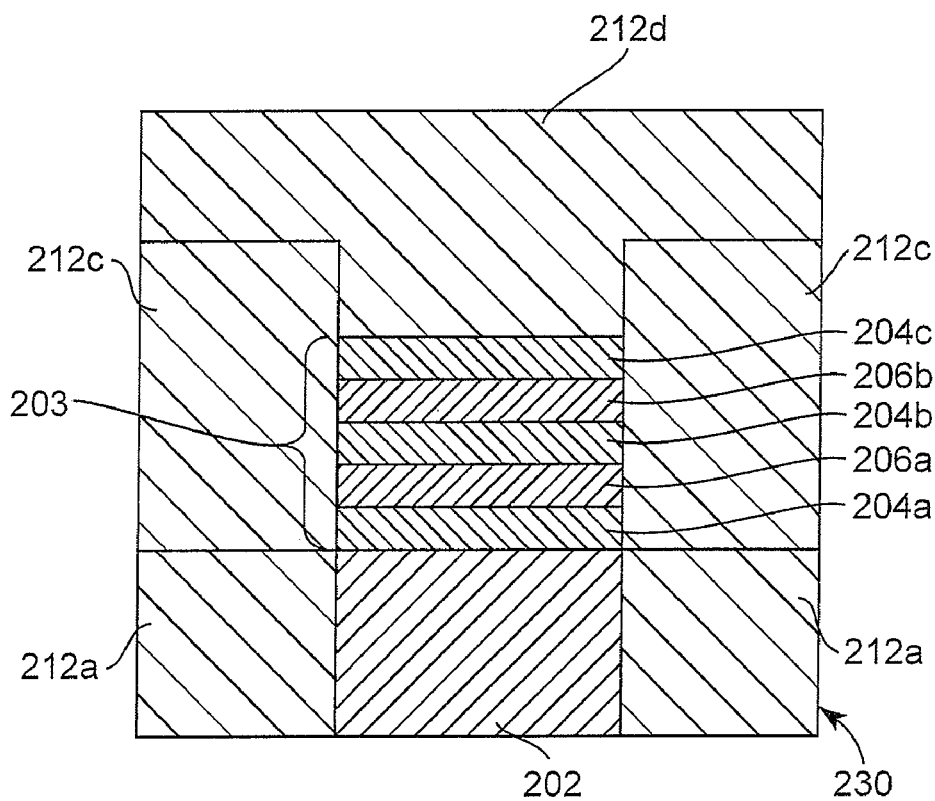
FIG. 10 illustrates a cross-sectional view of one embodiment of the preprocessed wafer, the bottom electrode, the first dielectric material layer, and a second dielectric material layer.

FIG. 10 illustrates a cross-sectional view of one embodiment of preprocessed wafer 230, bottom electrode 203, first dielectric material layer 212c, and a second dielectric material layer 212d. A dielectric material, such as $SiO_2$, $SiO_x$, SiN, FSG, BPSG, BSG, or other suitable dielectric material is deposited over exposed portions of bottom electrode 203 and first dielectric material layer 212c to provide second dielectric material layer 212d. Second dielectric material layer 212d is deposited using CVD, HDP-CVD, ALD, MOCVD, PVD, JVD, or other suitable deposition technique.

Figure 11:
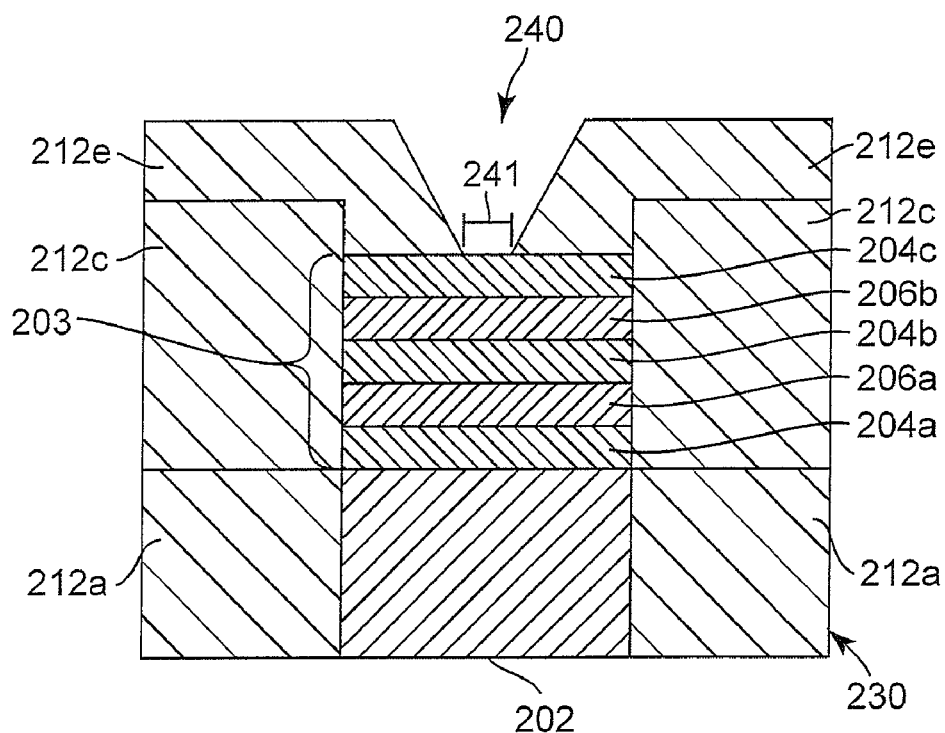
FIG. 11 illustrates a cross-sectional view of one embodiment of the preprocessed wafer, the bottom electrode, the first dielectric material layer, and the second dielectric material layer after etching.

FIG. 11 illustrates a cross-sectional view of one embodiment of preprocessed wafer 230, bottom electrode 203, first dielectric material layer 212c, and second dielectric material layer 212e after etching an opening or pore 240 into second dielectric material layer 212d. Second dielectric material layer 212d is etched to expose a portion of bottom electrode 203 and to provide second dielectric material layer 212e. Pore 240 includes tapered sidewalls such that the exposed portion of bottom electrode 203 has a sublithographic cross-section as indicated at 241. Ini one embodiment, pore 240 is substantially centered over bottom electrode 203.

In one embodiment, a spacer material, such as SiN or another suitable spacer material is conformally deposited over exposed portions of bottom electrode 203 and second dielectric material layer 212e to provide a spacer material layer. The spacer material layer is deposited using CVD, HDP-CVD, ALD, MOCVD, PVD, JVD, or other suitable deposition technique. The spacer material layer is then spacer etched to provide spacers on the sidewalls of pore 240, which further reduces the cross-section of the exposed portion of bottom electrode 203.

Figure 12:
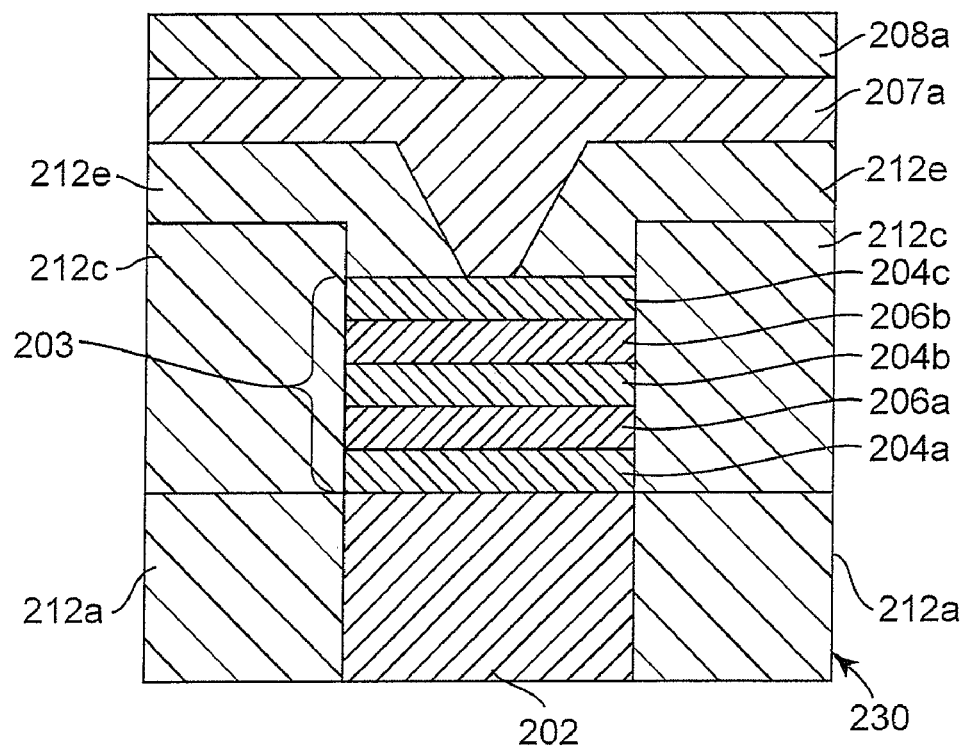
FIG. 12 illustrates a cross-sectional view of one embodiment of the preprocessed wafer, the bottom electrode, the first dielectric material layer, the second dielectric material layer, a phase change material layer, and an electrode material layer.

FIG. 12 illustrates a cross-sectional view of one embodiment of preprocessed wafer 230, bottom electrode 203, first dielectric material layer 212c, second dielectric material layer 212e, a phase change material layer 207a, and an electrode material layer 208a. A phase change material, such as a chalcogenide compound material or other suitable phase change material is deposited over exposed portions of second dielectric material layer 212e and bottom electrode 203 to provide phase change material layer 207a. Phase change material layer 207a is deposited using CVD, HDP-CVD, ALD, MOCVD, PVD, JVD, or other suitable deposition technique.

An electrode material, such as TiN, TaN, W, Al, Ti, Ta, TiSiN, TaSiN, TaCN, TiAlN, TaAlN, Cu, WN, C, or other suitable electrode material is deposited over phase change material layer 207a to provide electrode material layer 208a. Electrode material layer 208a is deposited using CVD, HDP-CVD, ALD, MOCVD, PVD, JVD, or other suitable deposition technique.

Figure 13:
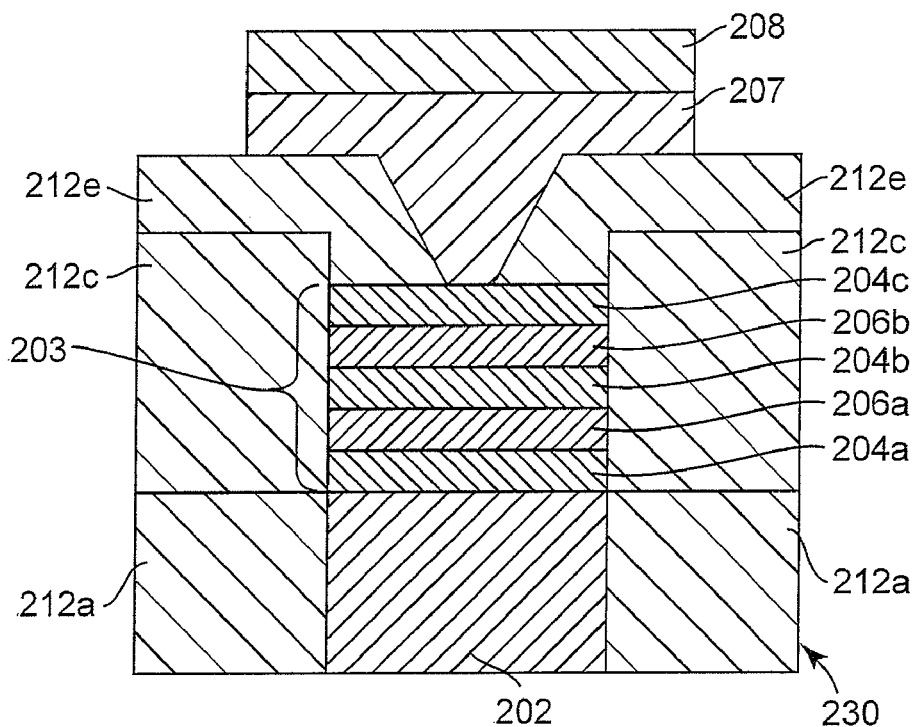
FIG. 13 illustrates a cross-sectional view of one embodiment of the preprocessed wafer, the bottom electrode, the first dielectric material layer, the second dielectric material layer, a phase change material storage location, and a top electrode after etching.

FIG. 13 illustrates a cross-sectional view of one embodiment of preprocessed wafer 230, bottom electrode 203, first dielectric material layer 212c, second dielectric material layer 212e, phase change material storage location 207, and top electrode 208 after etching electrode material layer 208a and phase change material layer 207a. Electrode material layer 208a and phase change material layer 207a are etched to expose portions of second dielectric material layer 212e and to provide phase change material storage location 207 and top electrode 208. In another embodiment, phase change material storage location 207 is provided using a damascene process. In one embodiment, top electrode 208 and phase change material storage location 207 are substantially centered over bottom contact 203.

Figure 14:
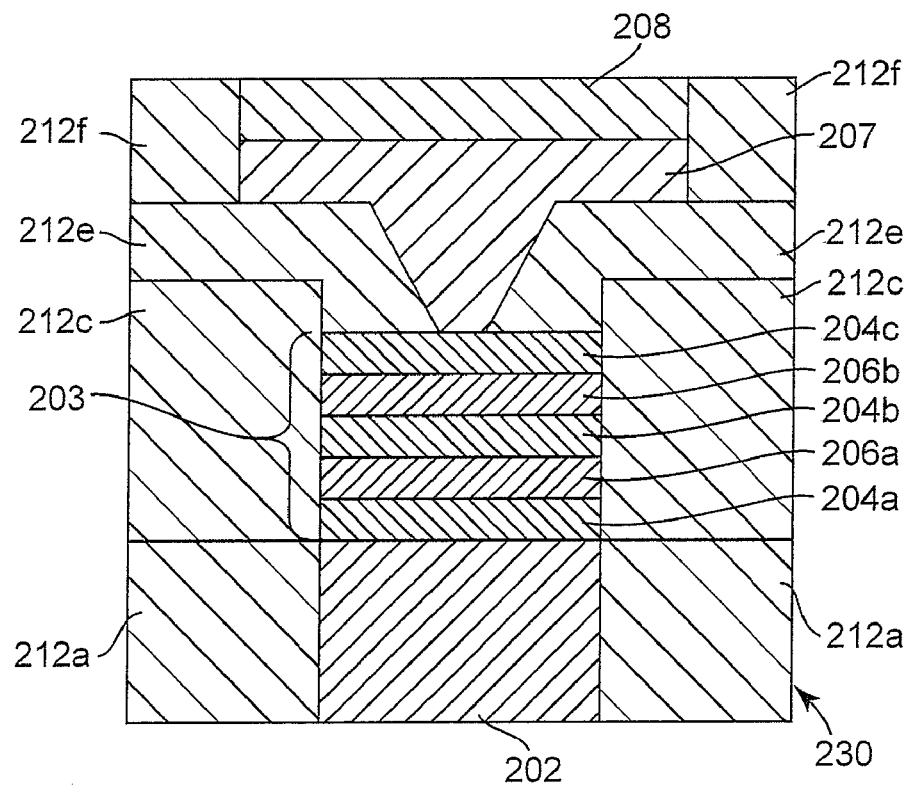
FIG. 14 illustrates a cross-sectional view of one embodiment of the preprocessed wafer, the bottom electrode, the first dielectric material layer, the second dielectric material layer, the phase change material storage location, the top electrode, and a third dielectric material layer.

FIG. 14 illustrates a cross-sectional view of one embodiment of preprocessed wafer 230, bottom electrode 203, first dielectric material layer 212c, second dielectric material layer 212e, phase change material storage location 207, top electrode 208, and a third dielectric material layer 212f. A dielectric material, such as $SiO_2$, $SiO_x$, SiN, FSG, BPSG, BSG, or other suitable dielectric material is deposited over exposed portions of top electrode 208, phase change material storage location 207, and second dielectric material layer 212e to provide a third dielectric material layer. The third dielectric material layer is deposited using CVD, HDP-CVD, ALD, MOCVD, PVD, JVD, or other suitable deposition technique. The third dielectric material layer is then planarized to expose top electrode 208 and to provide third dielectric material layer 212f. The third dielectric material layer is planarized using CMP or another suitable planarization technique. Top contact 210 is then formed over top electrode 208 using additional deposition and etching processes to provide phase change element 200 as previously described and illustrated with reference to FIG. 3.

Embodiments of the present invention provide a phase change element including a multilayer bottom electrode. The multilayer bottom electrode reduces the heat loss from the phase change material during programming of the memory cell. By reducing the heat loss, the bottom electrode reduces the current used to program the memory cell.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a contact;
   a first electrode coupled to the contact, the first electrode including at least two electrode material layers, the at least two electrode material layers comprising different materials:
   a second electrode; and
   a resistivity changing material between the first electrode and the second electrode,
   wherein the first electrode comprises a first electrode material layer contacting a second electrode material layer, and a third electrode material layer contacting the second electrode material layer, the first electrode material layer comprising a same material as the third electrode material layer, and the first electrode material layer comprising a different material from the second electrode material layer.

2. The integrated circuit of claim 1, wherein the second electrode material layer comprises one of TiN, TaN, W, WN, TiSiN, TiAlN, TaSiN, TaCN, TaAlN, C, Si, Ge, and a phase change material.

3. The integrated circuit of claim 1, wherein the first electrode material layer comprises one of TiN, TaN, W, WN, TiSiN, TiAlN, TaSiN, TaCN, TaAlN, and C.

4. The integrated circuit of claim 1, wherein the resistivity changing material comprises phase change material.

5. The integrated circuit of claim 1, wherein the first electrode thermally insulates the contact from the resistivity changing material.

6. The integrated circuit of claim 1, wherein the resistivity changing material comprises a first portion having a first cross-sectional width and a second portion having a second cross-sectional width different from the first cross-sectional width.

7. The integrated circuit of claim 6, wherein the first portion is tapered and contacts the first electrode.

8. The integrated circuit of claim 6, wherein the second portion contacts the second electrode, and
   wherein the second cross-sectional width is equal to a cross-sectional width of the second electrode.

9. The integrated circuit of claim 1, wherein the contact comprises one of TiN, TaN, W, Al, Ti, Ta, TiSiN, TaSiN, TaCN, TiAlN, TaAlN, Cu, WN, and C.

10. The integrated circuit of claim 1, wherein the resistivity changing material provides a storage location for storing one or more bits of data.

11. The integrated circuit of claim 1, further comprising:
    dielectric material laterally surrounding the contact, the first electrode, the second electrode, and the resistivity changing material.

12. The integrated circuit of claim 11, wherein the dielectric material comprises one of $SiO_2$, $SiO_x$, SiN, fluorinated silica glass (FSG), boro-phosphorous silicate glass (BPSG), and boro-silicate glass (BSG).

13. An integrated circuit comprising:
    a contact;
    a first electrode coupled to the contact, the first electrode including at least three electrode material layers, at least two of the at least three electrode material layers comprising different materials;
    a second electrode; and
    a resistivity changing material between the first electrode and the second electrode.

14. An integrated circuit of claim 13, wherein the first electrode comprises at least four electrode material layers.

15. An integrated circuit of claim 13, wherein the first electrode comprises at least five electrode material layers.

16. The integrated circuit of claim 13, wherein at least one of the electrode material layers comprises one of TiN, TaN, W, WN, TiSiN, TiAlN, TaSiN, TaCN, TaAlN, C, Si, Ge, and a phase change material.

17. The integrated circuit of claim 13, wherein the resistivity changing material comprises phase change material.

18. The integrated circuit of claim 13, wherein the first electrode thermally insulates the contact from the resistivity changing material.

19. The integrated circuit of claim 13, wherein the resistivity changing material comprises a first portion having a first cross-sectional width and a second portion having a second cross-sectional width different from the first cross-sectional width.

20. The integrated circuit of claim 19, wherein the first portion is tapered and contacts the first electrode.

21. The integrated circuit of claim 19, wherein the second portion contacts the second electrode, and
    wherein the second cross-sectional width is equal to a cross-sectional width of the second electrode.

22. The integrated circuit of claim 13, wherein the contact comprises one of TiN, TaN, W, Al, Ti, Ta, TiSiN, TaSiN, TaCN, TiAlN, TaAlN, Cu, WN, and C.

23. The integrated circuit of claim 13, wherein the resistivity changing material provides a storage location for storing one or more bits of data.

24. The integrated circuit of claim 13, further comprising:
    dielectric material laterally surrounding the contact, the first electrode, the second electrode, and the resistivity changing material.

25. The integrated circuit of claim 24, wherein the dielectric material comprises one of $SiO_2$, $SiO_x$, SiN, fluorinated silica glass (FSG), boro-phosphorous silicate glass (BPSG), and boro-silicate glass (BSG).

* * * * *